(12) United States Patent
Nguyen et al.

(10) Patent No.: US 9,431,201 B2
(45) Date of Patent: Aug. 30, 2016

(54) MICROMECHANICAL RESONANT SWITCHES AND CHARGE PUMPS

(71) Applicant: THE REGENTS OF THE UNIVERSITY OF CALIFORNIA, Oakland, CA (US)

(72) Inventors: Clark T.-C. Nguyen, Oakland, CA (US); Yang Lin, Albany, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/959,034

(22) Filed: Dec. 4, 2015

(65) Prior Publication Data

US 2016/0155595 A1    Jun. 2, 2016

Related U.S. Application Data

(63) Continuation of application No. PCT/US2014/041440, filed on Jun. 7, 2014.

(60) Provisional application No. 61/832,656, filed on Jun. 7, 2013.

(51) Int. Cl.
*H01H 59/00* (2006.01)
*H02M 3/07* (2006.01)
*H03H 9/24* (2006.01)

(52) U.S. Cl.
CPC .......... *H01H 59/0009* (2013.01); *H02M 3/07* (2013.01); *H03H 9/2426* (2013.01)

(58) Field of Classification Search
CPC ................................. H01H 59/0009
USPC ............. 331/154, 116 M; 310/309; 333/186
See application file for complete search history.

(56) References Cited

U.S. PATENT DOCUMENTS 8,237,521 B1* 8/2012 Smith ................ G01P 15/0802
    200/181
2007/0096729 A1* 5/2007 Brunson ............. G01R 33/022
    324/244
2011/0241766 A1   10/2011 Zhang et al.

FOREIGN PATENT DOCUMENTS

JP    2009-272757 A    11/2009
KR    10-2009-0108219 A    10/2009
KR    10-2010-0078424 A    7/2010
KR    10-2012-0115013 A    10/2012

OTHER PUBLICATIONS

Korean Intellectual Property Office (KIPO), International Search Report and Written Opinion, PCT/US2014/041440, issued Mar. 16, 2015, pp. 1-11, with claims searched, pp. 12-16. Counterpart to the application filed herewith.

* cited by examiner

*Primary Examiner* — Joseph Chang
(74) *Attorney, Agent, or Firm* — O'Banion & Ritchey LLP; John P. O'Banion

(57) ABSTRACT

A circuit of N micromechanical resonant switches (resoswitches) is presented, which mimics a Dickson charge pump to amplify an input voltage to an output voltage of N plus 1 times the input voltage, while avoiding the diode voltage drop and breakdown voltage limitations of CMOS-based conventional charge pumps. Important aspects of successful charge pumping are: 1) the long cycle lifetime of resonant micromechanical switches, which has been shown to operate $173.9 \times 10^{12}$ cycles, is orders of magnitude higher than non-resonant switches; 2) the use of gated-sinusoid drive excitation to allow a charging period independent of resoswitch resonance frequency; and 3) the use of resonance operation to lower required drive and DC-bias voltages to below the supply voltage. This mechanical charge pump obviates the need for custom high voltage CMOS for applications where large voltages are needed such as MEMS-based timing references, thereby allowing the use of virtually any CMOS process.

33 Claims, 15 Drawing Sheets

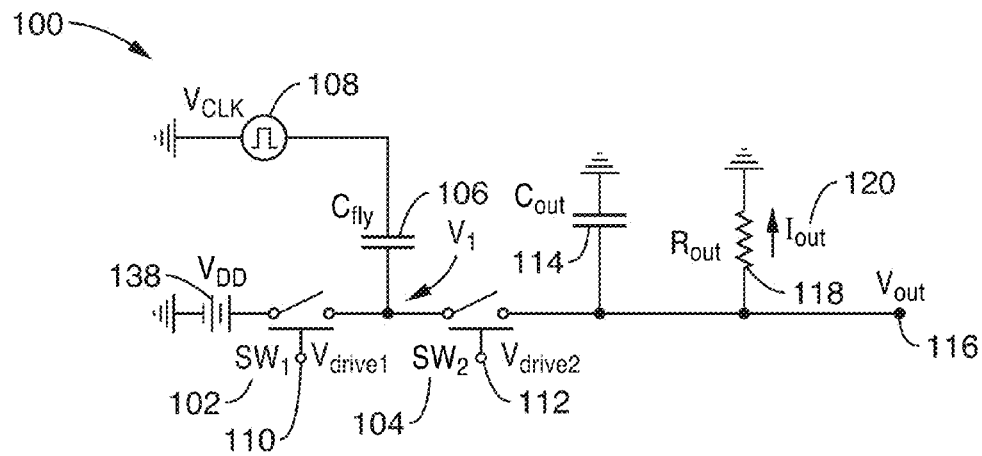
FIG. 1A
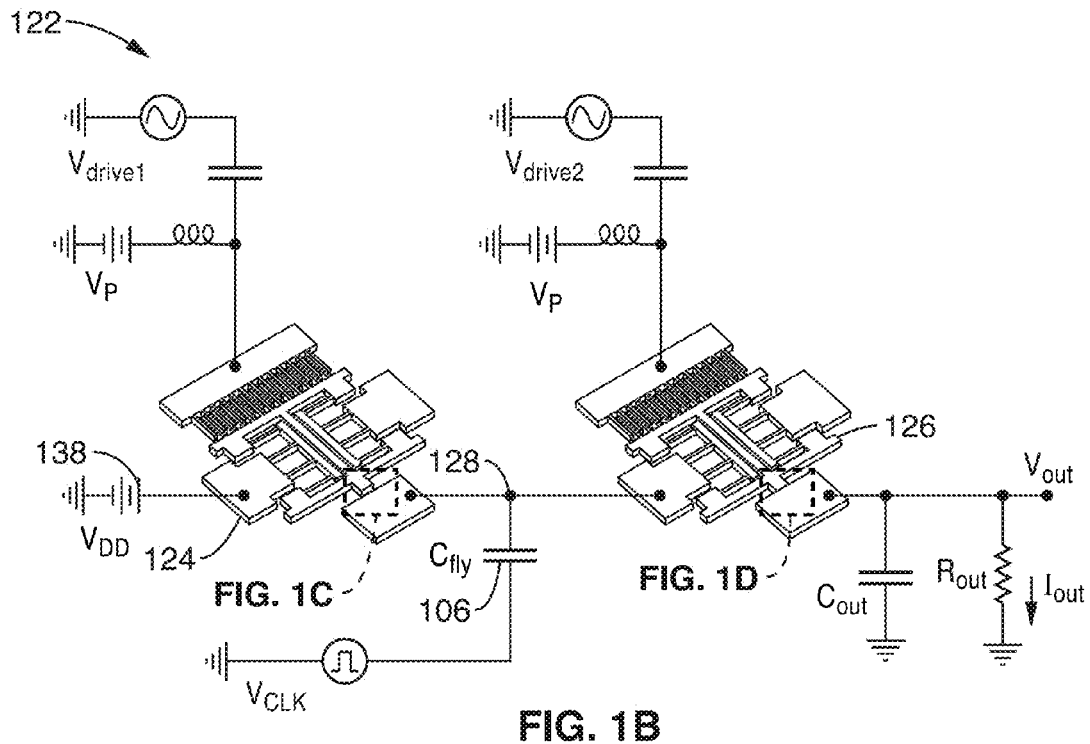
FIG. 1B
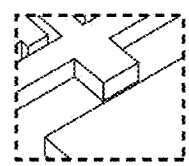　　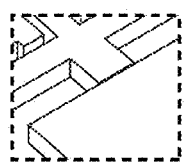
FIG. 1C　　　　FIG. 1D

MICROMECHANICAL RESONANT SWITCHES AND CHARGE PUMPS

CROSS-REFERENCE TO RELATED APPLICATIONS

This application is a 35 U.S.C. §111(a) continuation of PCT international application number PCT/US2014/041440 filed on Jun. 7, 2014, incorporated herein by reference in its entirety, which claims priority to, and the benefit of, U.S. provisional patent application Ser. No. 61/832,656 filed on Jun. 7, 2013, incorporated herein by reference in its entirety. Priority is claimed to each of the foregoing applications.

The above-referenced PCT international application was published as PCT International Publication No. WO 2015/030898 on Mar. 5, 2015 and republished on May 7, 2015, which publications are incorporated herein by reference in their entireties.

STATEMENT REGARDING FEDERALLY SPONSORED RESEARCH OR DEVELOPMENT

This invention was made with Government support under NBCH1090001, awarded by the Defense Advanced Research Projects Agency (DARPA). The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

The technology described herein pertains generally to microelectromechanical systems (MEMS) devices and more particularly to novel micromechanical resonant switches and charge pumps. Conventional microelectromechanical systems (MEMS) switches can be plagued by low closure cycle lifetimes and other drawbacks in various applications.

BRIEF SUMMARY

A circuit of N micromechanical resonant switches (resoswitches) may be used in a Dickson charge pump to boost input voltages $V_{in}$ from a DC power supply to higher output voltages $V_{out}$ according to $V_{out}$ (N+1) $V_{in}$ while avoiding the diode voltage drop and breakdown voltage limitations of CMOS- or transistor-based conventional charge pumps.

Important aspects of successful charge pumping are: 1) the long cycle lifetime of resonant micromechanical switches, which at $173.9 \times 10^{12}$ cycles is orders of magnitude higher than non-resonant switches; 2) the use of gated-sinusoid excitation to allow a charging period independent of switch resonance frequency; and 3) the use of resonance operation lowers the required drive and DC-bias voltages to below the supply voltage. In particular, input voltages below diode band gaps may now be used in the devices.

The resulting resonant switch-based mechanical charge pump now obviates the need for custom high voltage CMOS for applications where large voltages are needed, e.g., MEMS-based timing references, thereby allowing the use of virtually any CMOS process.

While the resonant switches are described here within the context of a Dickson charge pump, other gated switching operations and other charge pump topologies are equally applicable.

By using gated sinusoids tuned to particular resonant switches, differences in resonant frequencies among various resonant switches may be accommodated.

Further resonant switch enhancements include atomic layer deposition (ALD) of ruthenium (Ru) or nickel (Ni) to lower switch contact resistance.

A silicide may also be used as a contact material. In this embodiment metal is deposited over a silicon structure, then raised to a sufficient temperature that they react to form a silicide. The silicide may then serve as the contact material. Additionally, switch contacts may be constructed of either a rectangular or triangular geometry for increased contact forces. The increased contact forces tend to lower switch contact resistance.

Important aspects of the resonant switch are the interdigitated drive electrode and shuttle that allow for non-contact electrostatic drive of the resonant shuttle in the device.

Another important aspect of the resonant switch is the folded beam geometry, which leads to an overall small device footprint. Additionally, such folded beams may be constructed in a laterally symmetric fashion, so that the modal frequency is widely separated from other vibration modes. In layman's terms, the shuttle is constrained to move only back and forth. When a sufficient amplitude of oscillation is achieved, then the shuttle contact impacts the output electrode, thereby activating the resonant switch.

Further aspects of the technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 1A is a diagrammed schematic of an improved single stage Dickson charge pump according to an embodiment of the technology described herein.

FIG. 1B is a diagrammed schematic of a resoswitch implementation of the charge pump schematic of FIG. 1A according to an embodiment of the technology described herein.

FIG. 1C is an enlarged view of the open circuit resonant switch of FIG. 1B.

FIG. 1D is an enlarged view of how a closed circuit resonant switch of FIG. 1B would appear.

DETAILED DESCRIPTION

Introduction

Figure 1E:
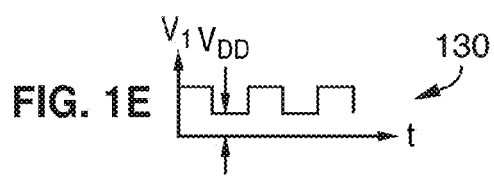
FIG. 1E is a graph of the voltage $V_1$ versus time in the FIG. 1B implementation of the Dickson charge pump according to an embodiment of the technology described herein.

With very few exceptions, capacitively transduced microelectromechanical systems (MEMS) devices perform better when high voltages are available. Whether the device is a simple resonator, a gyroscope, an accelerometer, a movable mirror, or a motor, the higher the available voltage, the larger the output signal, as measured by a current, a voltage, or a displacement. In an ideal world, a preferred voltage used for MEMS devices would probably be in the 100-200 V range.

Unfortunately, other technologies—e.g., batteries, transistors with which the MEMS are often configured—cannot supply or do not often function well with such large voltages. Nevertheless, some MEMS products on the market require large voltages, such as digital micromirror displays (DMD) and the high Q capacitively transduced resonators used in some timing oscillators. Many of these products rely on charge pumps to supply such voltages, most often realized via the transistor technology that accompanies them. So far, complementary metal oxide silicon (CMOS) based charge pumps perform well when generating voltages on the order of 10-15 V, but for higher voltages (>15 V) the transistor body effect substantially degrades pumping efficiency, and dielectric and p-n junction breakdown ultimately limit the maximum attainable voltage.

Voltages exceeding 30 V require custom (expensive) CMOS technologies, such as silicon on insulator (SOI) or triple/deep n-well versions. Ideally, voltage levels required or desired by the MEMS devices would be decoupled from other technologies.

Here, a MEMS-based charge pump is demonstrated that employs micromechanical resonant switches (also referred to as "resoswitches") in a Dickson configuration to generate 2 V from a 1 V power supply in a single stage. Such stages may be repeated to obtain higher voltages. Here, the use of mechanical switches eliminates diode or threshold voltage drops and raises the breakdown voltage limit to over 100 V. This MEMS-based circuit also accepts a much wider range of input DC voltages, from values much smaller than a typical transistor threshold, to values much larger than a typical transistor breakdown voltage. In most cases, the charge pump can simply be fabricated alongside other MEMS devices.

Refer now to FIG. 1A, which is a schematic 100 of a single stage Dickson charge pump. Here, two resonant switches 102 and 104 are used as switching devices to transfer charge and voltage to and from a fly back capacitor $C_{fly}$ 106 that is driven with a pulsed waveform of amplitude $V_{CLK}$ 108. The resonant switches 102 and 104 are respectively driven by drive voltages $V_{drive1}$ 110 and $V_{drive2}$ 112. Output capacitor $C_{out}$ 114 smoothes the output voltage $V_{out}$ 116 into output load $R_{out}$ 118 with output current $I_{out}$ 120.

Refer now to FIG. 1B, which is a diagrammed schematic 122 of a resonant switch (referred to hereafter as a "resoswitch") implementation of the charge pump schematic of FIG. 1A. Here, the resoswitches 124 and 126 replace the switching elements 102 and 104 respectively of FIG. 1A. Note that $V_1$ 128 is the nodal voltage of the fly back capacitor 106 disposed between the resoswitches 124 and 126.

Refer now to FIG. 1C and FIG. 1D, which are enlarged views of an open and closed circuit resonant switch, respectively.

Refer now to FIG. 1E, which is a graph 130 of the voltage $V_1$ versus time in the FIG. 1B implementation of the Dickson charge pump.

Figure 1F:
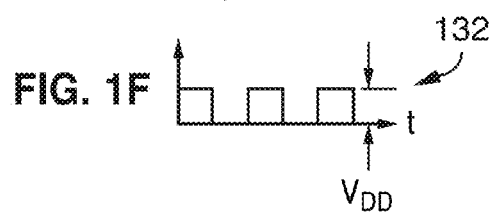
FIG. 1F is a graph of the voltage $V_{CLK}$ versus time in the FIG. 1B implementation of the Dickson charge pump according to an embodiment of the technology described herein.

Refer now to FIG. 1F, which is a graph 132 of the voltage $V_{CLK}$ versus time in the FIG. 1B implementation of the Dickson charge pump.

Figure 1G:
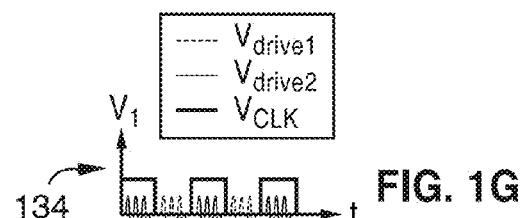
FIG. 1G is a graph of the voltages $V_{CLK}$, $V_{drive1}$, and $V_{drive2}$ versus time in the FIG. 1B implementation of the Dickson charge pump according to an embodiment of the technology described herein.

Refer now to FIG. 1G, which is a graph 134 of the voltages $V_{CLK}$, $V_{drive1}$, and $V_{drive2}$ versus time in the FIG. 1B implementation of the Dickson charge pump.

Figure 1H:
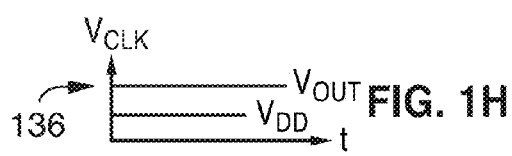
FIG. 1H is a graph of the voltages $V_{DD}$, and $V_{OUT}$ versus time in the FIG. 1B implementation of the Dickson charge pump.

Refer now to FIG. 1H, which is a graph 136 of the voltages $V_{DD}$ (denoted as 138 of FIG. 1A and FIG. 1B) and $V_{out}$ (116 in FIG. 1A) versus time in the FIG. 1B implementation of the Dickson charge pump.

Before describing the charge pump in detail, it would be instructive to first establish how high of a voltage is desired by considering an example application.

MEMS Higher Voltage Requirements

One good example of a MEMS device that benefits greatly from high voltage is the capacitively transduced vibrating RF resonator used in timing oscillators already on the market, and targeted for use in next generation wireless communication architectures, such as software-defined cognitive radio. Such devices are attractive for these applications largely due to their unprecedentedly high Q, which may now reach over 40,000 at 3 GHz.

However, this Q is unfortunately accompanied by an abysmal coupling coefficient, for which $C_x/C_o$ is only 0.000068% with $V_p$=8V that in turn translates to a motional resistance $R_x$=81 kΩ, which is many times larger than the 50Ω normally expected by conventional radio frequency (RF) circuits.

Figure 2A:
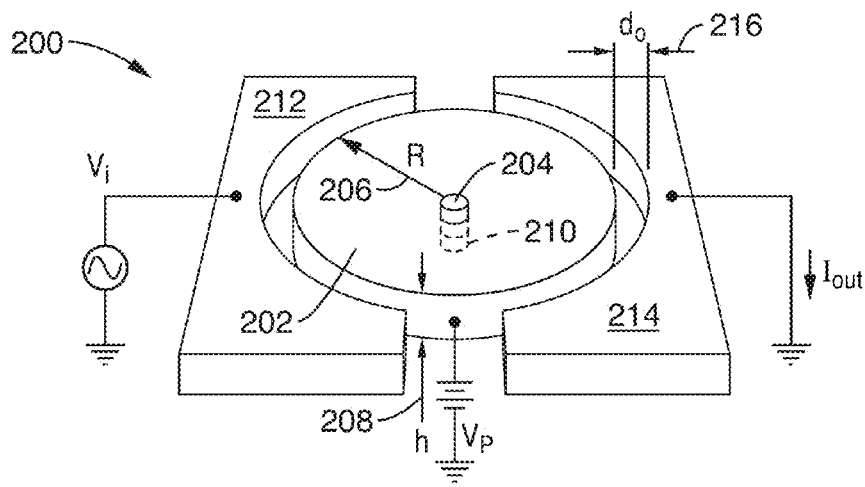
FIG. 2A is a diagrammed schematic of a prior art charge-based disk resonator.

Refer now to FIG. 2A, which is a diagrammed schematic 200 of a prior art charge-based disk resonator. Here, a disk 202 of with center 204 has a radius R 206 and thickness h 208, and is supported by a stem 210. An input electrode 212 and an output electrode 214 are separated from the disk 202 by a radial distance $d_0$ 216.

Figure 2B:
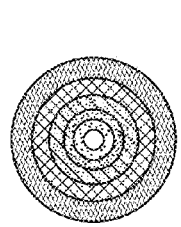
FIG. 2B is a top view of the finite element modeled (FEM) mode shape of the disk resonator of FIG. 2A.

Refer now to FIG. 2B, which is a top view 218 of the finite element modeled (FEM) mode shape of the disk resonator of FIG. 2A.

Figure 2C:
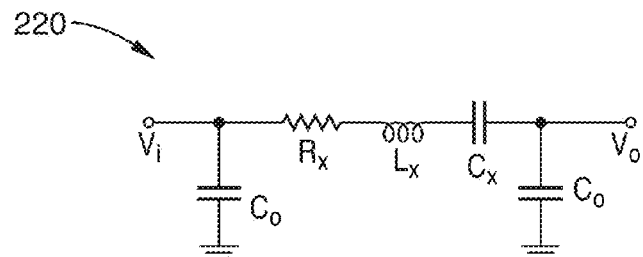
FIG. 2C is a schematic of an equivalent circuit of the disk resonator of FIG. 2A.

Refer now to FIG. 2C, which is a schematic 220 of an equivalent circuit of the disk resonator of FIG. 2A.

To explore how high voltage can solve this problem, expressions for the $R_x$ and $C_x/C_o$ for the classic radial-contour mode capacitive-gap transduced disk resonator summarized in FIG. 2A can be written as $$R_x = \frac{\sqrt{k_r m_r}\, d_o^4}{Q\varepsilon^2 A^2 V_P^2}, \quad \frac{C_x}{C_o} = \frac{\varepsilon A V_P^2}{k_r d_o^3} \qquad \text{Eq. 1}$$

where A and $d_o$ do are the overlap area and gap between the electrode and disk, respectively; $k_r$ and $m_r$ are the dynamic stiffness and mass of the disk, respectively; and $V_p$ is the DC-bias voltage applied to the resonator.

Figure 3:
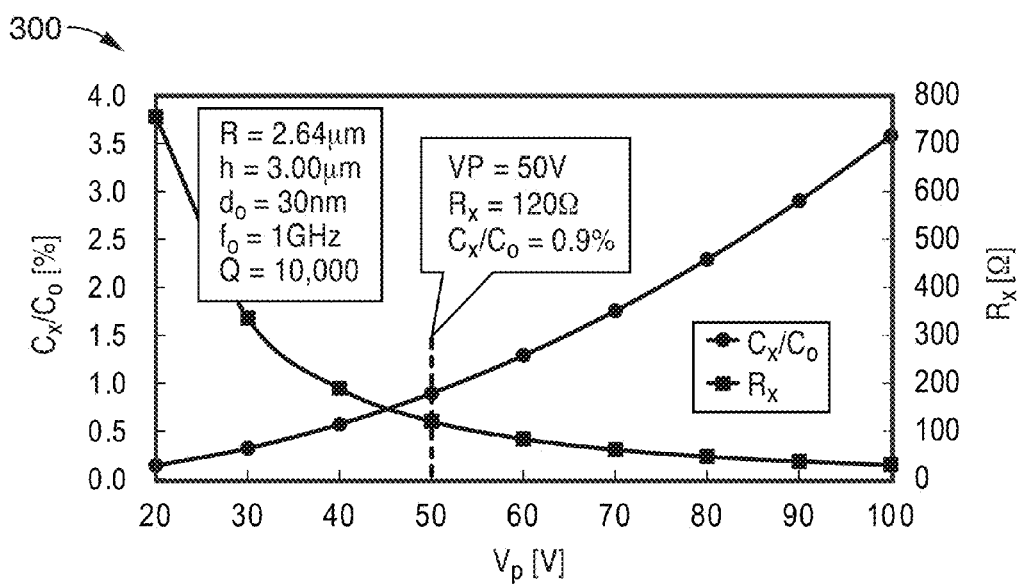
FIG. 3 is a graph 300 of $R_x$ and ($C_x/C_o$) versus $V_p$ for a 1-GHz radial-contour mode disk resonator.

Refer now to FIG. 3, which is a graph 300 of $R_x$ and $(C_x/C_o)$ versus $V_P$ for a 1-GHz radial-contour mode disk resonator. FIG. 3 uses Eq. 1 to plot $R_x$ and $C_x/C_o$ versus $V_P$ for a 1-GHz disk with a reasonable electrode-to-resonator gap spacing of 30 nm, showing how $V_p$ levels above 50 V allow $C_x/C_o$>1% and $R_x$ values<200Ω, which are on par with values attainable by similarly-sized piezoelectric resonators. The use of $V_p$=100 V would actually exceed the capabilities of contour-mode $d_{31}$-transduced AlN piezoelectric devices.

Note that DC-biasing essentially amounts to charging the electrode-to-resonator overlap capacitance. Thus, if a charge pump were employed to provide the charge, it needs to be turned on only for very short periods, between which the disk can hold its charge (against very small parasitic leakage currents) for time periods on the order of 15 minutes.

Figure 4A:
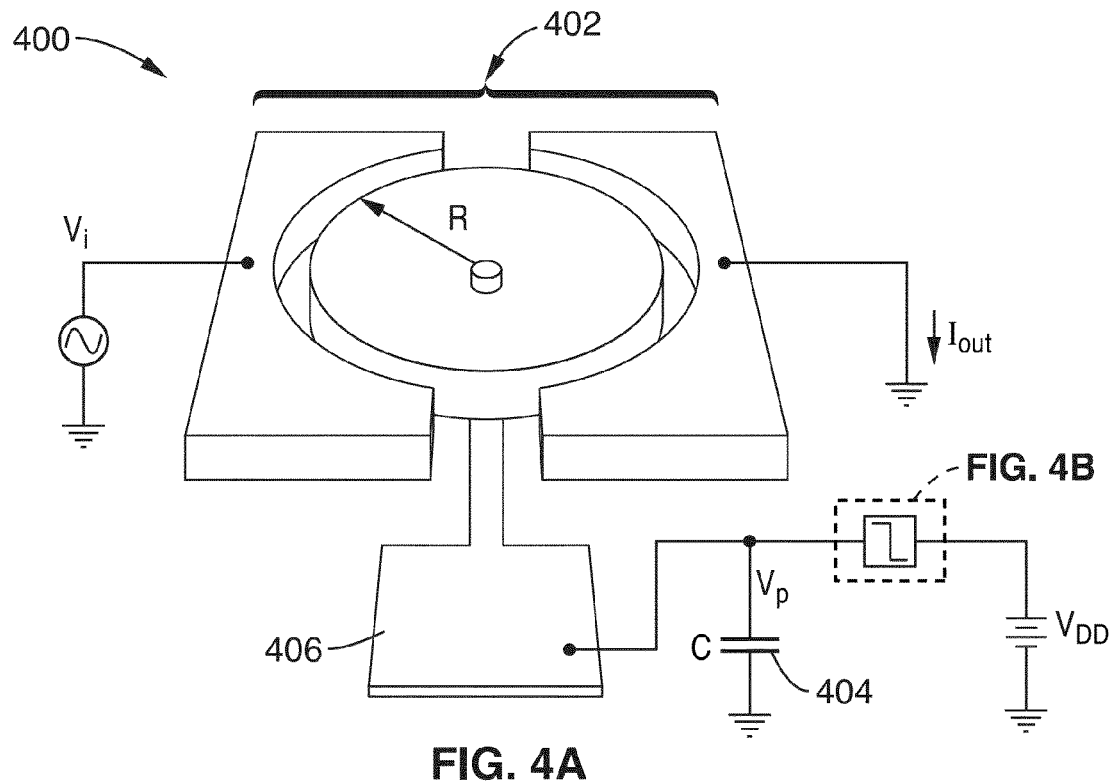
FIG. 4A is a diagrammed schematic of a charge-biased disk resonator employing an intermittent charge pumping scheme according to an embodiment of the technology described herein.

Refer now to FIG. 4A, which is a diagrammed schematic 400 of a charge-biased disk resonator 402 employing an intermittent charge pumping scheme. If a capacitor C 404 is placed in parallel with the resonator's bias port 406, as in FIG. 4, then the refresh time interval can be quite long, e.g., 65 hours for a 0.18 pF capacitor C 404.

Figure 4B:
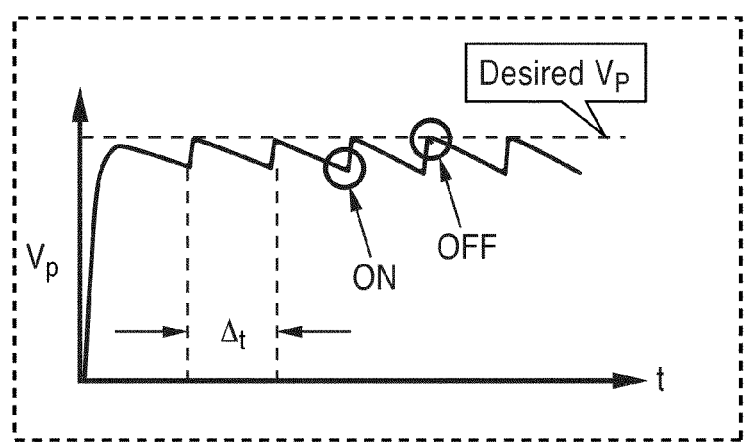
FIG. 4B is a graph of the pump voltage $V_p$ versus time of the device of FIG. 4A.

Refer now to FIG. 4B, which is a graph of the pump voltage $V_p$ versus time of the device of FIG. 4A. It is apparent here that the desired pump voltage $V_p$ is maintained at a nearly constant level.

In FIG. 4B, the time interval $\Delta_t$ is a function of how long the voltage $V_P$ can remain within a certain voltage range (indicated by the sawtooth amplitude). The length of time indicates when the charge pump needs to be turned on. For example, if the time is 1 hour, then the charge pump need be turned on for maybe 1 second every hour. This means that it will consume very little power.

The Dickson Charge Pump

Figure 5A:
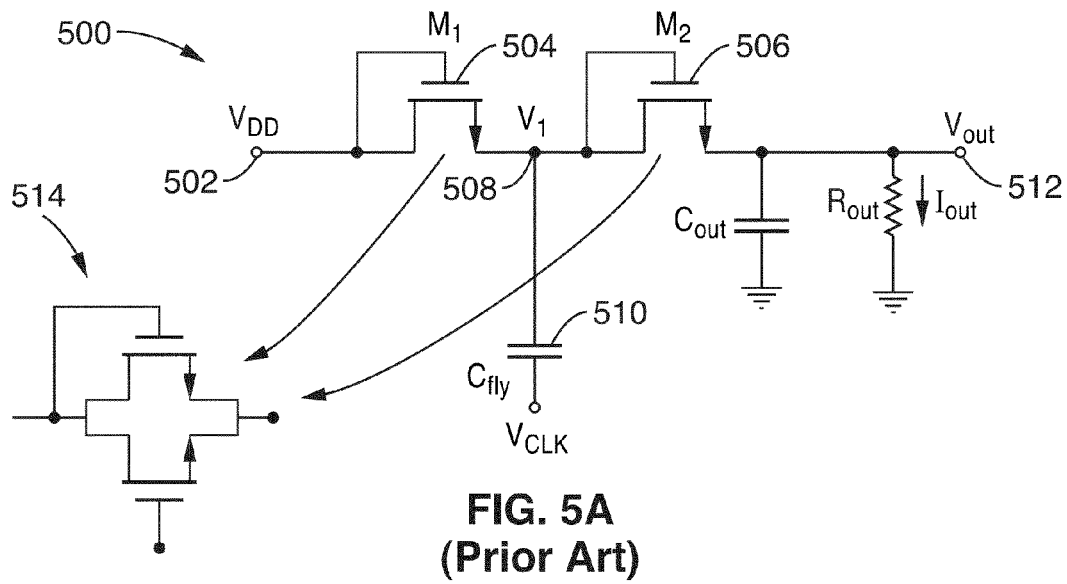
FIG. 5A is a prior art schematic of a single stage complementary metal oxide silicon (CMOS) Dickson charge pump.

Refer now to FIG. 5A, which is a schematic 500 of a conventional single stage complementary metal oxide silicon (CMOS) Dickson charge pump. Here, an input DC voltage $V_{DD}$ 502 is switched by two switches 504 and 506 in series. $V_1$ 508 is the intermodal voltage between switches 504 and 506, and is common with fly back capacitor $C_{fly}$ 510, which is driven in turn by $V_{CLK}$ 512.

For comparison with the MEMS version, it is instructive to first consider a conventional Dickson charge pump. FIG. 5A presents the schematic and waveforms for a classic prior art single-stage CMOS Dickson charge pump, where input DC voltage $V_{DD}$ 502 is fed to two diode-connected MOS (metal oxide semiconductor) transistors in series with the intermediate node $V_1$ 508 connected to the top plate of a capacitor $C_{fly}$ 510, with bottom plate driven by a clock signal $V_{CLK}$ 512 periodically toggling between $V_{DD}$ and GND.

When $V_{DD}$ is at GND, $M_1$ 504 turns on, and $V_{DD}$ 502 charges $C_{fly}$ 510 until $V_1V=DD-V_{th}$, where $V_{th}$ is the threshold voltage of $M_1$ 504 and $M_2$ 506. Next, when $V_{CLK}$ toggles to $V_{DD}$, $V_1$ 508 becomes $2V_{DD}-V_{th}$ instantaneously, at which point $M_1$ 504 is off and $M_2$ 506 turns on to transfer charge stored on $C_{fly}$ 510 to the output node $V_{out}$ 512, resulting in an output voltage $V_{out}=2V_{DD}-2V_{th}$.

When N similar stages are cascaded, the output voltage reaches $(N+1)(V_{DD} V_{th})$. To eliminate the diode drop term $V_{th}$, the MOS diodes in FIG. 5A can be replaced with pass-gate transistors, such as by 514, after which the attainable voltage would be $(N+1) V_{DD}$. Ideally any voltage can be generated given enough stages. Unfortunately, in a CMOS charge pump the actual output voltage level is normally limited by the dielectric and p-n junction breakdown voltages of the transistors, e.g. 10-15 V in a 0.18 µm technology. Custom CMOS technologies, e.g., SOI and triple/deep n-well, exist to circumvent this limit, but at higher cost and integration complexity.

Figure 5B:
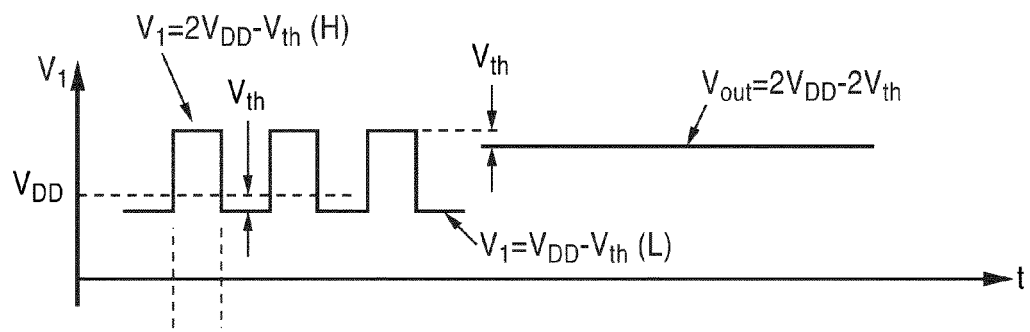
FIG. 5B is a graph of $V_{DD}$ versus time for the charge pump of FIG. 5A.

Refer now to FIG. 5B, which is a graph of $V_{DD}$ versus time for the charge pump of FIG. 5A.

Figure 5C:
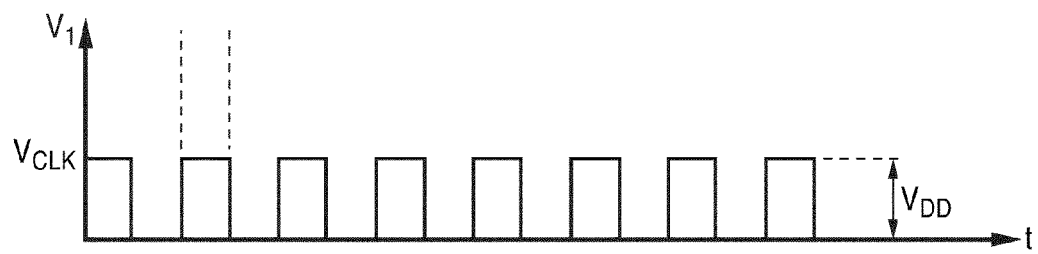
FIG. 5C is a graph of $V_{CLK}$ (versus time for the charge pump of FIG. 5A.

Refer now to FIG. 5C, which is a graph of $V_{CLK}$ versus time for the charge pump of FIG. 5A.

Fortunately, improved switches provided by MEMS technology enable a more efficient version of the Dickson charge pump. Previously described FIG. 1A presents the basic approach using ideal switches. Here, switches $SW_1$ and $SW_2$ replace the diodes (or MOS switches) of FIG. 5A.

Refer now back to FIG. 1A and FIG. 1B. To transfer charge along only one direction, $SW_1$ 102 and $SW_2$ 104 must switch on in alternate phases, meaning their turn-on voltages $V_{drive1}$ 110 and $V_{drive2}$ 112 must be on in opposite clock phases. If this is the case, then charge transferred from $V_{DD}$ 138 to $V_1$ 128 during the clock down cycle gets boosted to $V_{DD}+V_{CLK}$ during the clock up cycle, at which point $SW_1$ 102 is off and $SW_2$ 104 turns on to transfer the charge (and voltage) to the awaiting output capacitor. Since there are no voltage drops and the break-down voltage can be higher than 100 V, the output voltage equal to $(N+1) V_{DD}$ can be quite high.

Conventional MEMS switches typically require very large actuation voltages, usually >50 V; and they are notorious for their poor reliability, as measured by limited cycle counts before failure. To address these problems, resonant micromechanical switches, a.k.a., resoswitches, are used here.

Comb-Driven Resoswitches

Micromechanical resoswitches use resonance operation to greatly improve switch performance. In particular, when at resonance, displacements amplify by Q, so actuation voltages are small even though the stiffness of the device can be quite large. The large stiffness in turn allows very fast operation (due to the high resonance frequency) and very reliable operation, since large stiffness represent large restoring forces that prove useful against any sticking phenomenon.

Figure 6A:
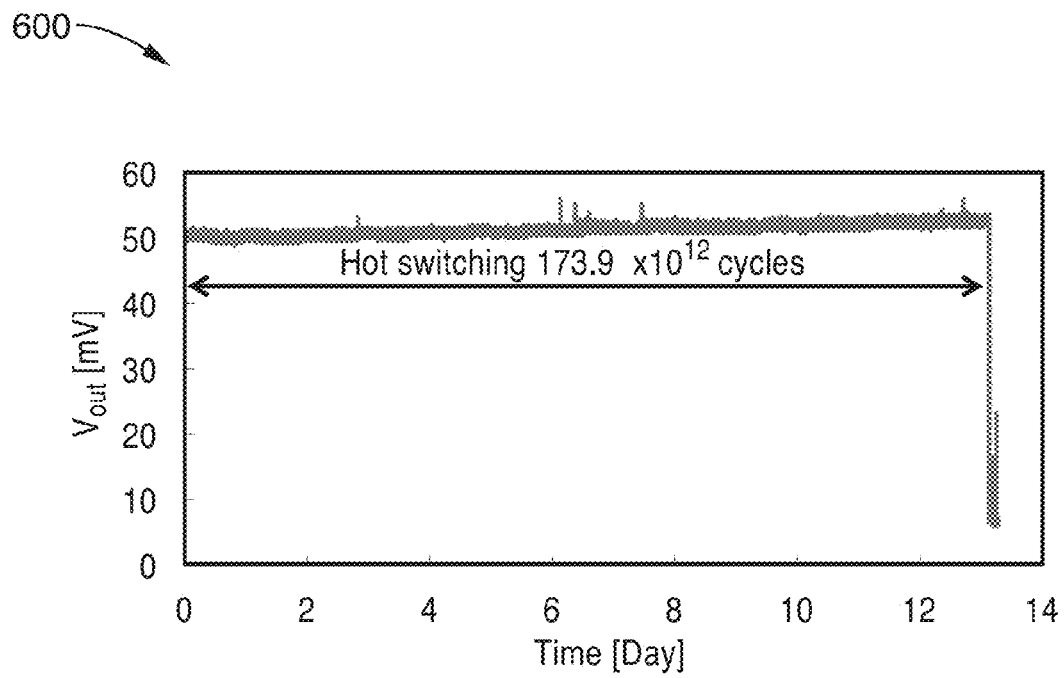
FIG. 6A is a graph of $V_{out}$ versus time for a displacement amplifying polysilicon disk resoswitch, which thereby indicates the cycle lifetime of the resoswitch.

Refer now to FIG. 6A, which is a graph 600 of $V_{out}$ versus time for a displacement amplifying polysilicon disk resoswitch, which thereby indicates the cycle lifetime of the resoswitch.

To illustrate, FIG. 6A presents cycle lifetime data obtained for a displacement amplifier version of a polysilicon disk resoswitch (shown in the inset), which posts $173.9 \times 10^{12}$ hot-switched cycles. The device actually did not fail; rather, its frequency shifted away from that of the drive signal, preventing further impacting.

Figure 6B:
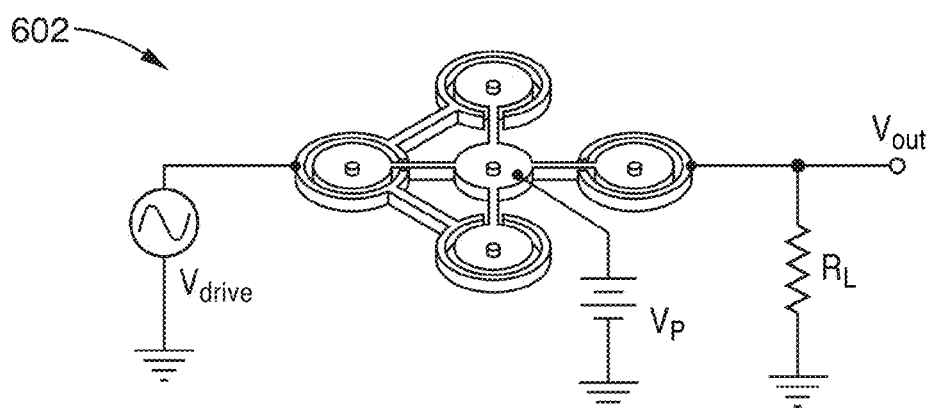
FIG. 6B is a diagrammed schematic of the polysilicon amplifying resoswitch tested in FIG. 6A.

Refer now to FIG. 6B, which is a diagrammed schematic 602 of the polysilicon amplifying resoswitch tested in FIG. 6A. Such polysilicon amplifying resoswitch represents an overkill solution for the present DC-biasing target application, at least from a frequency perspective. In particular, since a capacitively transduced MEMS device draws practically no current, a very low frequency charge pump is all that is needed. Thus, a much simpler comb-driven resoswitch may be used instead.

Figure 7A:
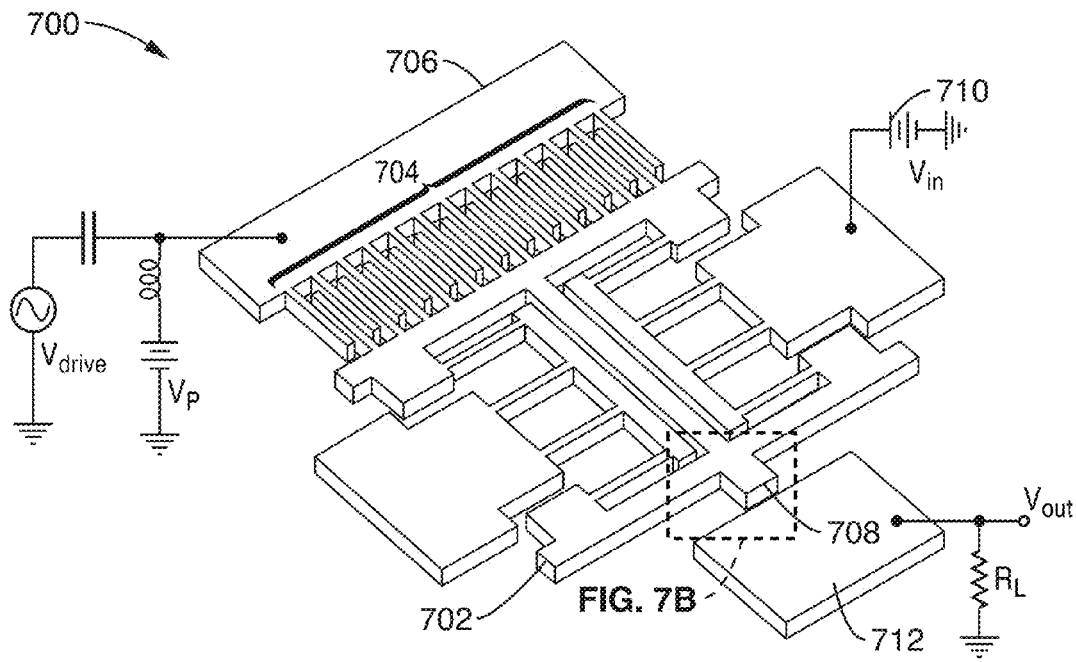
FIG. 7A is a diagrammed schematic of a comb-driven resoswitch according to an embodiment of the technology described herein.

Refer now to FIG. 7A, which is a diagrammed schematic of a comb-driven resoswitch 700. Here, a folded-beam supported shuttle 702 is capacitively driven by comb fingers 704 into resonance by an AC/DC voltage combination applied to comb fingers 704 on one side via a drive electrode 706. The ensuing resonance vibration then induces impacting at the switch point 708 on the other side, which periodically opens and closes the mechanical switch. Here, the switch point 708 is a flat, non-pointed contact region. During hot switching, the $V_{in}$ 710 input DC voltage is applied to the vibrating shuttle 702, and then periodically transferred to the output electrode 712 periodically. When operated under vacuum, the voltage amplitude required to actuate this device can be quite small.

Figure 7B:
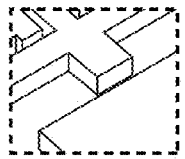
FIG. 7B is an enlarged view of the contact region of the resonant switch in the open state shown in FIG. 7A.

Refer now to FIG. 7B, which is an enlarged view of the contact region of the resonant switch in the open state shown in FIG. 7A. Here, the switch is in a nonconducting state.

Figure 7C:
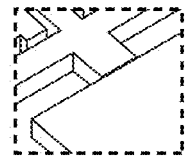
FIG. 7C is an enlarged view of how the contact region of the resonant switch in the closed state would appear in FIG. 7A.

Refer now to FIG. 7C, which is an enlarged view of how the contact region of the resonant switch in the closed state would appear in FIG. 7A. In this configuration, the switch would be in the conducting, or closed, state.

Figure 8:
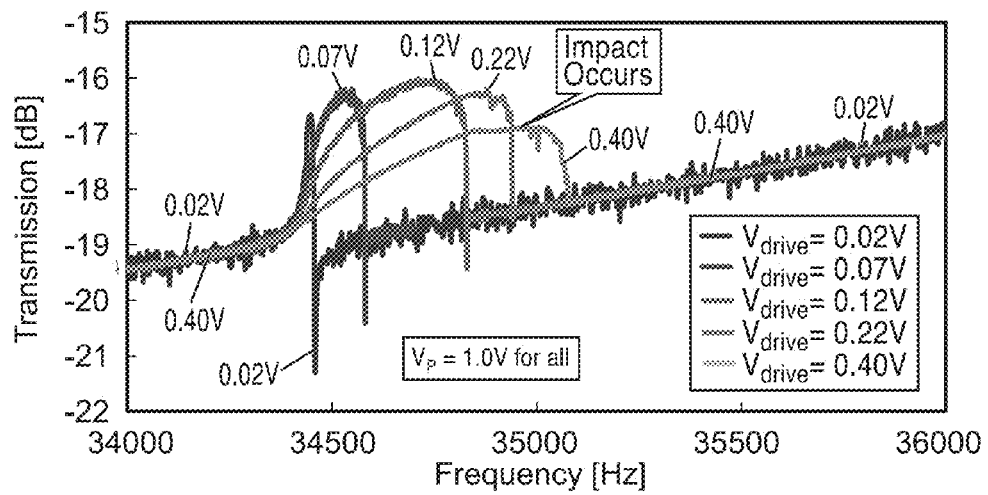
FIG. 8 is a graph of frequency responses of the comb-driven resoswitch measured in vacuum for varying resonance input AC voltage amplitudes, showing impacting when the response flattens.

Refer now to FIG. 8, which a graph of frequency responses of the comb-driven resoswitch of FIG. 7 measured in vacuum for varying resonance input AC voltage amplitudes, showing impacting when the response flattens. Here, the DC-bias is 1 V, and impacting occurs when the drive voltage amplitude is only 0.4 V, which is well under the 1 V supply voltage. Such impacting is enabled due to resonant Q amplification.

One advantage of the present comb-driven resoswitch versus previous disk versions is its amenability to fabrication via most traditional MEMS processes, which makes it compatible with a wide array of MEMS products. Representative comb-driven resoswitch devices described here were fabricated via a very simple one-mask process.

Figure 9A:
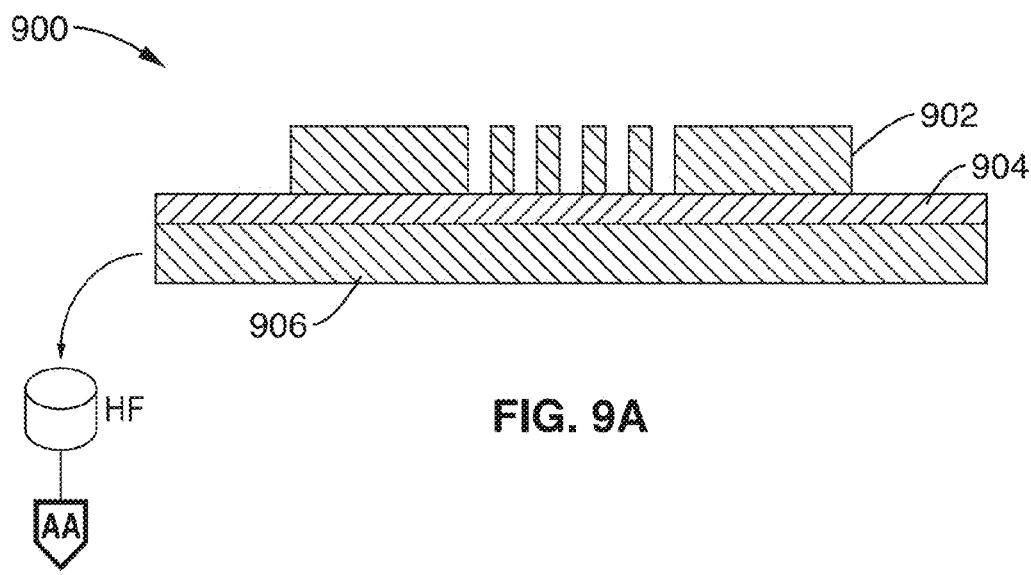
FIG. 9A is a cross-section summarizing a one-mask process flow used to fabricate comb-driven resoswitches, where the initial $SiO_2$ and polysilicon layers have been deposited on the substrate, according to an embodiment of the technology described herein.

Refer now to FIG. 9A, which is a cross-section 900 summarizing a one-mask process flow used to fabricate comb-driven resoswitches, where the initial patterned polysilicon 902 and SiO$_2$ layers 904 have previously been deposited on the substrate 906.

Figure 9B:
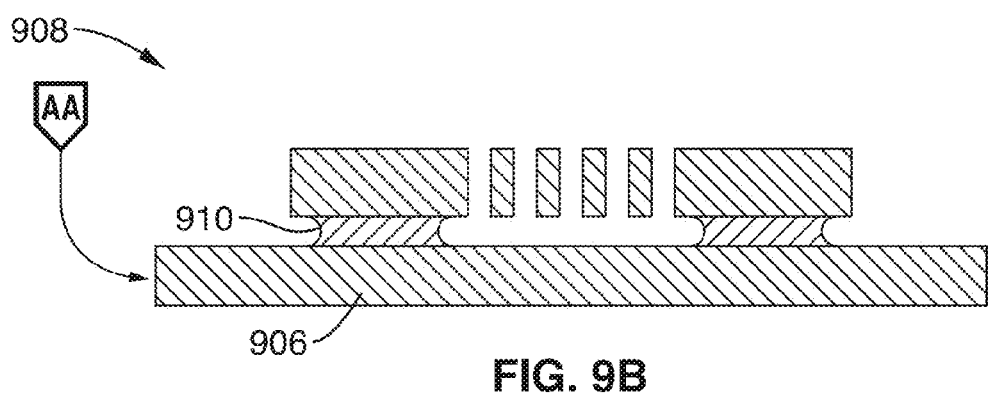
FIG. 9B is a cross-section summarizing a one-mask process flow used to fabricate comb-driven resoswitches, where the initial $SiO_2$ and polysilicon layers of FIG. 9A have been etched by HF.

Refer now to FIG. 9B, which is a cross-section 908 summarizing a one-mask process flow used to fabricate comb-driven resoswitches, where the initial polysilicon 902 and SiO$_2$ layers 904 of FIG. 9A have been etched by HF to form etched SiO$_2$ 910 that is used to selectively mount the polysilicon layer 902 to the substrate 906.

Figure 9C:
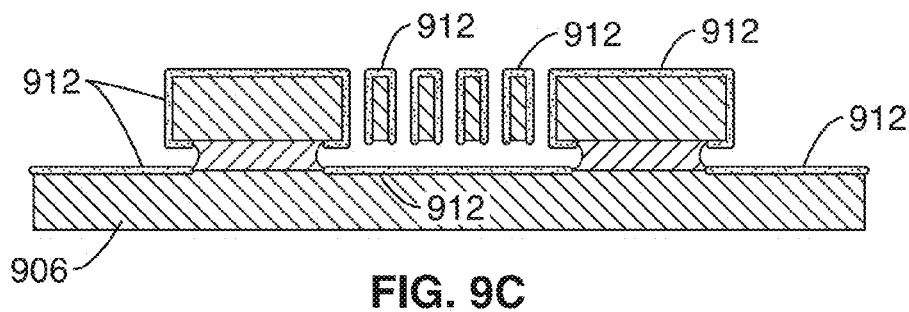
FIG. 9C is a cross-section summarizing a one-mask process flow used to fabricate comb-driven resoswitches, where the etched $SiO_2$ and polysilicon layers of FIG. 9B have been coated by Ru and subsequently thermally activated to create a ruthenium silicide coating.

Refer now to FIG. 9C, which is a cross-section summarizing a one-mask process flow used to fabricate comb-driven resoswitches, where the etched SiO$_2$ 910 and polysilicon layers 902 of FIG. 9B have been coated by Ru 912 and then raised to a sufficient temperature to allow the Ru to react with the Si in the polysilicon layer 902, thereby forming ruthenium silicide, which may serve as an electrical contact material.

Referring now to FIG. 9A, FIG. 9B, and FIG. 9C, the process is now described in greater detail. Initially, 3 μm of a polysilicon structural layer is deposited 904 and patterned over a 2 μm initial SiO$_2$ 902 sacrificial layer. Then the structure is time-released in HF solution to form the etched SiO$_2$ 910, followed by a (not-so-conformal) atomic layer deposition (ALD) or sputter deposition of 2-5 nm Ru 912.

The Ru 912 coating reduces switch contact resistance, which assists comb-driven resoswitches since their contact forces are much smaller than those of previous disks. For improved performance against squegging, the Ru 912 coating may be raised to a temperature sufficient to form ruthenium silicide. Such ruthenium silicide contacts have improved performance.

Figure 10A:
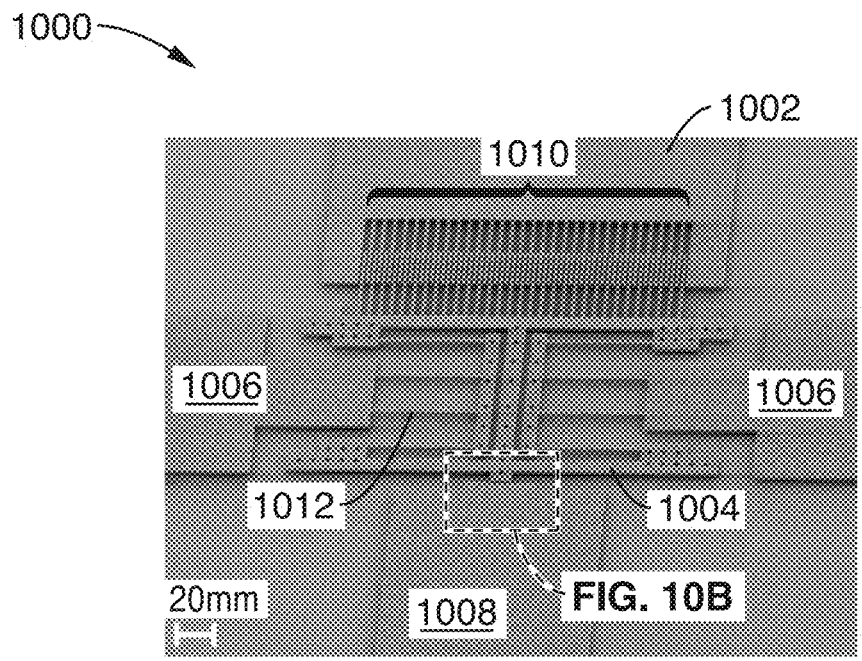
FIG. 10A is a scanning electron microscope (SEM) photo of a fabricated ALD-Ru-coated polysilicon comb-driven resoswitch according to an embodiment of the technology described herein

Refer now to FIG. 10A, which is a scanning electron micrograph (SEM) 1000 of a fabricated ALD-Ru-coated polysilicon comb-driven resoswitch. Here, the drive electrode 1002 actuates the shuttle 1004 to oscillate about anchors 1006 to enable contact with the switch electrode 1008. As previously discussed, the device is driven by the comb fingers 1010 that drive the shuttle 1004 back and forth through flexure of folded beams 1012 that are attached to the shuttle 1004 at one end, and to anchors 1006 on the other.

Figure 10B:
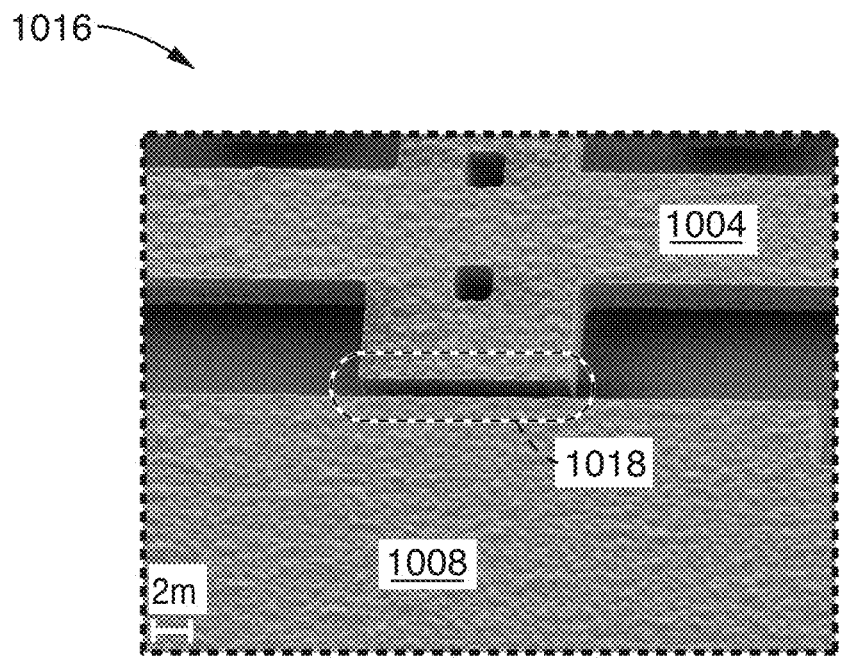
FIG. 10B is an enlarged scanning electron microscope (SEM) photo of the fabricated ALD-Ru-coated polysilicon comb-driven resoswitch of FIG. 10A, showing the switch contact area in greater detail.

Refer now to FIG. 10B, which is an enlarged scanning electron micrograph (SEM) 1016 of the fabricated atomic layer deposited (ALD)-Ru-coated polysilicon comb-driven resoswitch of FIG. 10A, showing the switch contact area 1018 in greater detail.

Figure 11A:
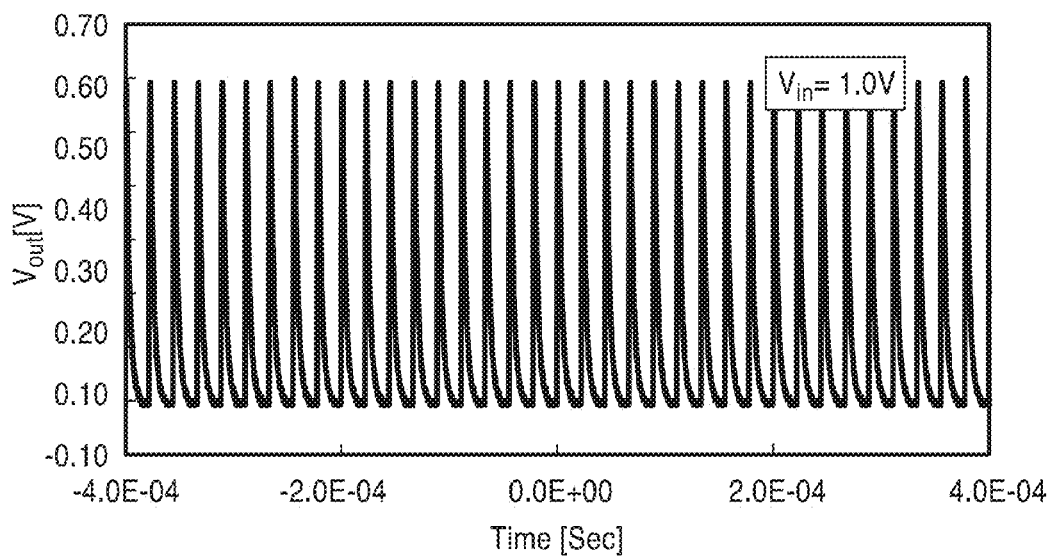
FIG. 11A is a graph of measured oscilloscope output waveforms for a comb-driven resoswitch when operated in the circuit of FIG. 7 with $V_{in}$ of 1.0 V.

Refer now to FIG. 11A, which is a graph of measured oscilloscope output waveforms for a comb-driven resoswitch when operated in the circuit of FIG. 7 with $V_{in}$ of 1.0 V.

Figure 11B:
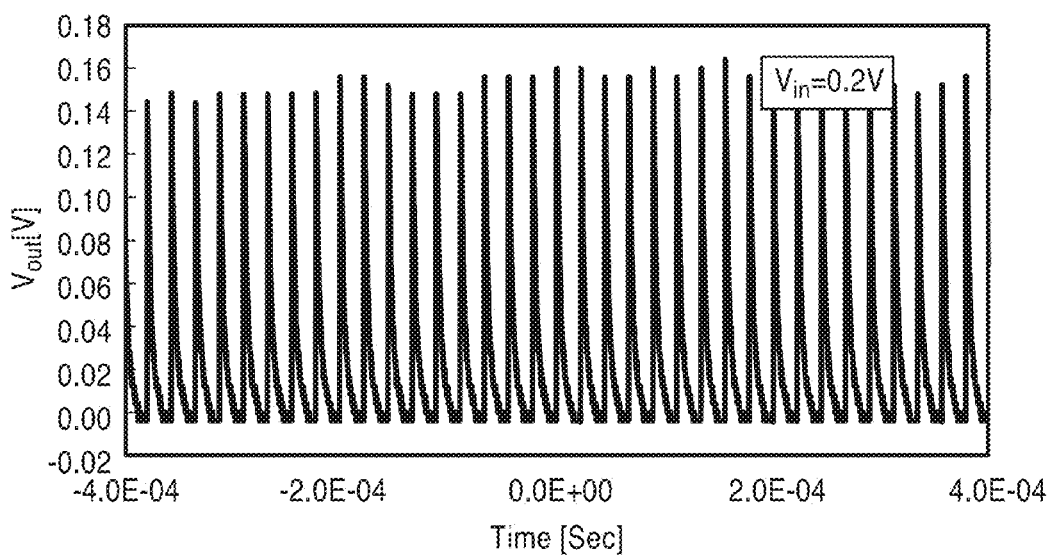
FIG. 11B is a graph of measured oscilloscope output waveforms for a comb-driven resoswitch when operated in the circuit of FIG. 7 with $V_{in}$ of 0.2V.

Refer now to FIG. 11B, which is a graph of measured oscilloscope output waveforms for a comb-driven resoswitch when operated in the circuit of FIG. 7 with $V_{in}$ of 0.2 V.

It should be noted here that some squegging occurs in FIG. 11B. In other words, the $V_{out}$ amplitude rises and falls with a constant period. This means the resoswitch contact varies with time. However, when using a gated sinusoid to drive the resoswitch, such squegging is not problematic, since a gated sinusoid input that induces sufficient impacts during the "gate on" period provides sufficient opportunity for charge transfer regardless of whether or not the impacts are continuous.

FIG. 11A and FIG. 11B together show that the resonant switch of FIG. 7 operates with no "diode" drop, thereby allowing very small voltages to be successfully transferred by these switches.

Resoswitch Charge Pump

Using the comb-driven resoswitches described above, a Dickson charge pump was built mimicking the circuit of FIG. 1A. Here, the charge pump was built with a few modifications shown in FIG. 1B to accommodate potentially different resonance frequency for each resoswitch, and to mitigate the effects of squegging. The potentially different resonant frequency limitation was overcome by using gated-sinusoids, $V_{drive1}$ and $V_{drive2}$ to effectively turn switches "on" and "off" at the period of the gate signal.

In particular, during half-cycles where the resonance sinusoid is on, the switch impacts, moving charge from one side to the other at its contact interface; and during the off cycle, the switch does not move, transfers no charge and is effectively "open."

The use of this gated-sinusoid excitation could operate to revolutionize the use of resonant switches, since it effectively removes the previously cumbersome restriction of resonant operation of the device. Here, the use of a gated sinusoid removes the need to operate the charge pump at a period defined by the mechanical resonance frequency of the device. In other words, the charge pumping period (or rate) may be controlled by merely selecting an appropriate gate period (for the gated sinusoid).

Figure 12:
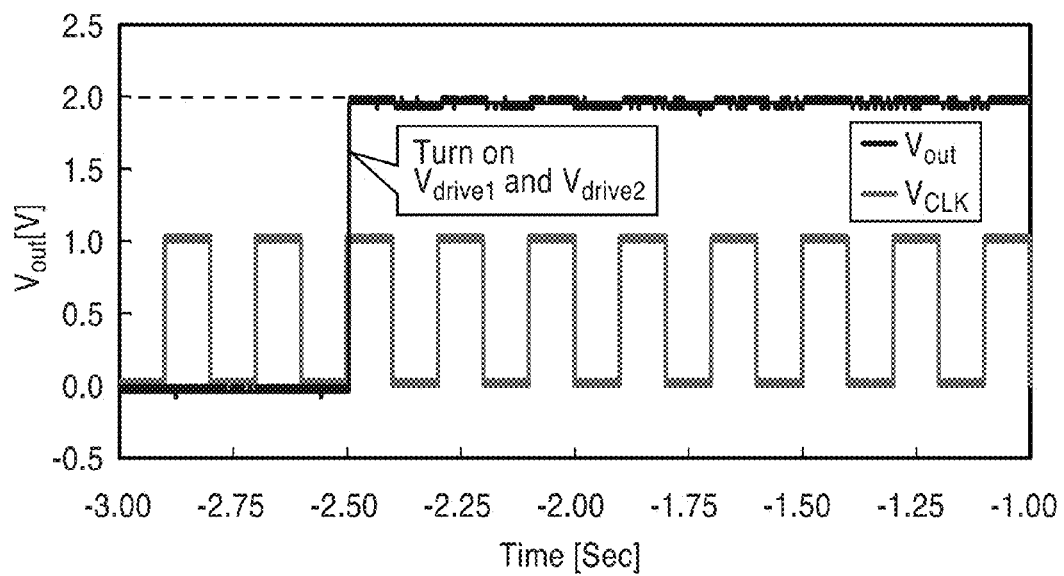
FIG. 12 is a graph of $V_{out}$ versus time of a single stage micromechanical charge pump together with the $V_{CLK}$ clock signal controlling gated sinusoids after application of $V_{drive1}$, and $V_{drive2}$.

Refer now to FIG. 12, which is a graph of $V_{out}$ versus time of a single stage micromechanical charge pump (previously described in FIG. 1B) together with the $V_{CLK}$ clock signal controlling gated sinusoids after application of $V_{drive1}$, and $V_{drive2}$.

Here, a 1 V input $V_{in}$ has been successfully boosted to 2 V at the output $V_{out}$ absent any diode voltage drop. Potentially, as additional resoswitch-capacitor stages are added, the charge-pumped voltage could be increased with each stage, as further discussed below.

N-Stage Dickson Charge Pump Implementation

Figure 13A:
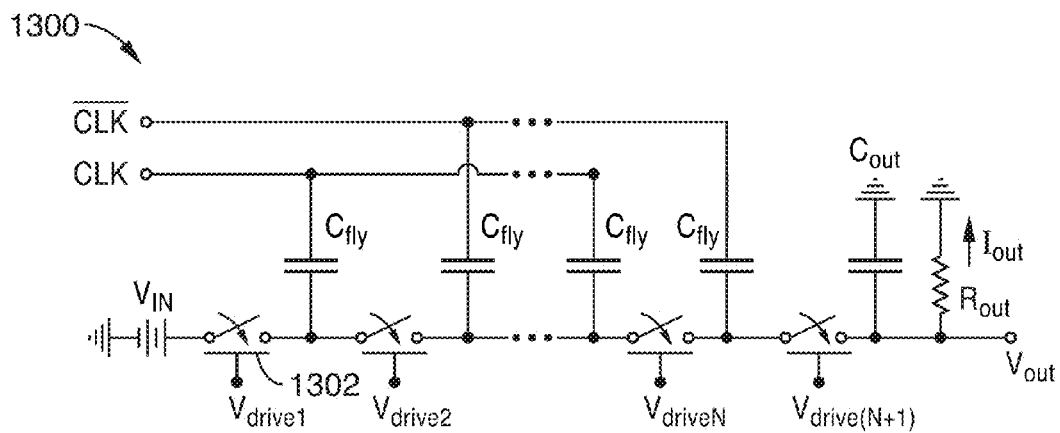
FIG. 13A is a schematic of an improved N-stage Dickson charge pump according to an embodiment of the technology described herein.
Figure 13B:
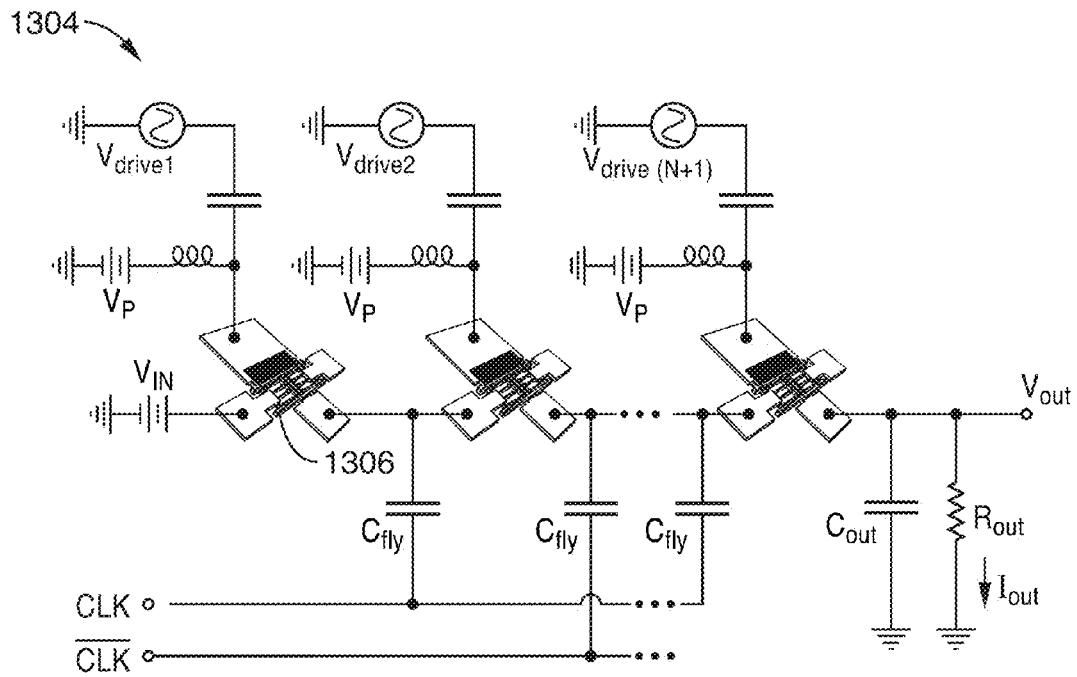
FIG. 13B is a diagrammed schematic of an N-stage MEMS-based resonant charge pump, where MEMS resonant devices implement the switches of FIG. 13A.

Refer now to FIG. 13A and FIG. 13B. FIG. 13A is a schematic 1300 of an N-stage Dickson charge pump with N switches 1302. FIG. 13B is a diagrammed schematic 1304 of the N-stage MEMS-based resonant charge pump, where MEMS resonant switches 1306 implement the N switches 1302 of FIG. 13A.

Using the diagrammed schematic 1304 of FIG. 13B, a micro-scale mechanical charge pump comprising a circuit of micromechanical resonant switches (resoswitches) has been demonstrated that generates 3 V and 9 V output voltages $V_{out}$ from 1 V and 3 V input $V_{in}$ power supplies, respectively, using a 2-stage design; and 6 V $V_{out}$ from 1 V $V_{in}$ supply using a 5-stage design, while simultaneously avoiding the diode voltage drop and breakdown voltage limitations of conventional CMOS-based charge pumps.

Due to the lack of diode drop voltages, the MEMS-based charge pump of FIG. 13A and FIG. 13B additionally accepts a much wider input voltage range than traditional semiconductor technology and obviates the need for custom high voltage CMOS for applications where larger voltages are needed, e.g., MEMS-based timing references.

With much higher breakdown voltages than transistor counterparts, the demonstrated MEMS resonant switch 1306 charge pump implementation should eventually allow output voltages $V_{out}$ higher than the 50 V typically desired for capacitive gap (comb finger) transduced resonators that presently dominate the commercial MEMS-based timing market.

N-Stage Dickson Charge Pump Mechanical Circuit Design and Operation

Figure 14A:
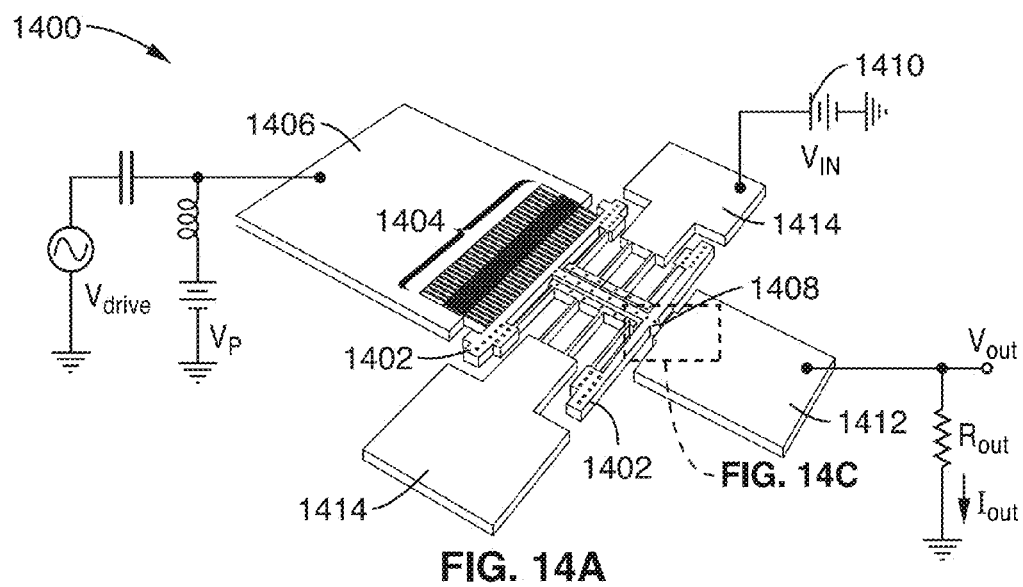
FIG. 14A is a diagrammed schematic of a comb-driven resoswitch 1400 that may be used as a switching component in the N-stage Dickson charge pump previously described in FIG. 13A and FIG. 13B.

Refer now to FIG. 14A, which is a diagrammed schematic of a comb-driven resoswitch 1400 that may be used as a switching component in the N-stage Dickson charge pump previously described in FIG. 13A and FIG. 13B. Here, a folded-beam supported shuttle 1402 is capacitively driven by comb fingers 1404 into resonance by an AC/DC voltage combination applied to comb fingers 1404 on one side via a drive electrode 1406. The ensuing resonance vibration then induces impacting at the switch point 1408 on the other side, which periodically opens and closes the mechanical switch. Here, the switch point 1408 is a triangular, pointed contact region that provides increased contact forces with consequent lower resistance contact closure when compared to non-pointed contact regions. During hot switching, the $V_{in}$ 1410 input DC voltage is applied to the vibrating shuttle 1402, and then periodically transferred to the output electrode 1412. When operated under vacuum, the voltage amplitude required to actuate this device can be quite small.

The drive electrode 1406, output electrode 1412, and anchor pads 1414 are all attached to a substrate (not shown here), whereas the shuttle 1402 is free to move while supported by folded beams 1416 that are attached to the anchor pads 1414 on one end, and the shuttle 1402 on the other end. Such support constrains the vibration of the shuttle 1402 so as to allow the switch point 1408 to make contact with the switch electrode 1412.

Figure 14B:
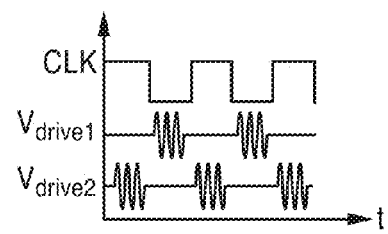
FIG. 14B is a graph of the CLK, $V_{drive1}$, and $V_{drive2}$ signals versus time for typical operation of the device in FIG. 14B.

Refer now to FIG. 14B, which is a graph of the CLK, $V_{drive1}$, and $V_{drive2}$ signals versus time for typical operation of the device in FIG. 14B.

Figure 14C:
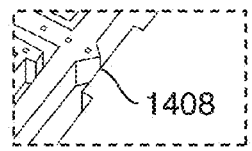
FIG. 14C is an enlarged view of the closed state of the switch point contact location of the device of FIG. 14A.

Refer now to FIG. 14C, which is an enlarged view of the closed switch at switch point 1408.

Figure 14D:
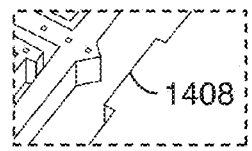
FIG. 14D is an enlarged view of how the open state would appear at the switch point contact location of the device of FIG. 14A.

Refer now to FIG. 14D, which is an enlarged view of the open switch at switch point 1408.

Figure 14E:
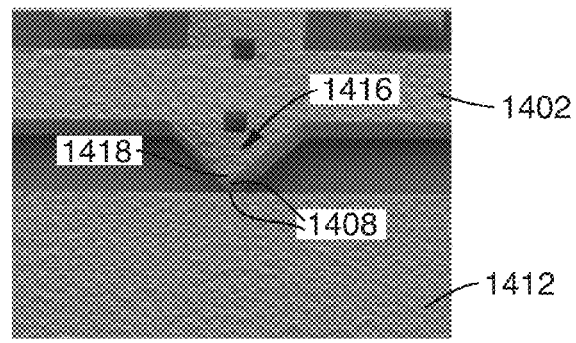
FIG. 14E is a scanning electron micrograph of one closed switch at the switch point contact location.

Refer now to FIG. 14E, which is a scanning electron micrograph of one (almost completely) closed switch using a triangular (or sharp) contact switch point 1408. Here, the triangular contact region 1416 of the moving shuttle 1402 has nearly made contact with the switch electrode 1412 via the sharp triangular point 1418. Such sharp triangular point 1408 allows for a higher impulsive force on the switch electrode 1412 when the triangular point 1408 makes a complete switch closure. The resonant switch device shown here was constructed of polysilicon with 2-5 nm of Ru deposited by ALD covering the switch point 1408 contact areas to reduce contact resistance.

While not shown here, a second fabrication run also yielded functional electroplated nickel resonant switching devices coated with Ru ALD in a process that maintains temperatures suitable for integration directly over CMOS.

N-Stage Dickson Charge Pump Experimental Results

Figure 15A:
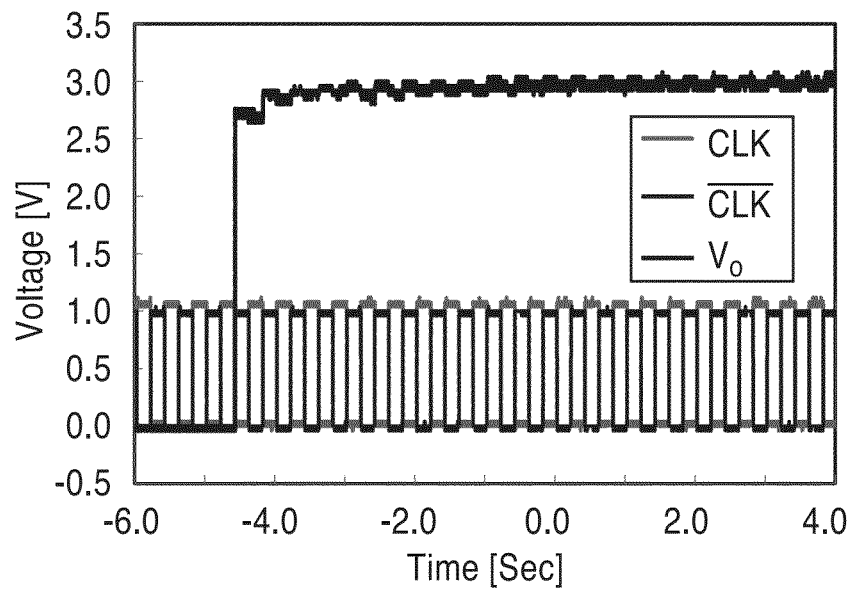
FIG. 15A is a graph of output waveforms of a 2-stage charge pump versus time, showing boosting of a 1 V supply voltage, CLK, and $\overline{CLK}$ signal by 3×, to a 3 V output $V_{out}$.

Refer now to FIG. 15A, which is a graph of output waveforms of a 2-stage charge pump versus time, showing boosting of a 1 V supply voltage, CLK, and $\overline{CLK}$ signal by 3×, to a 3 V output $V_{out}$.

Figure 15B:
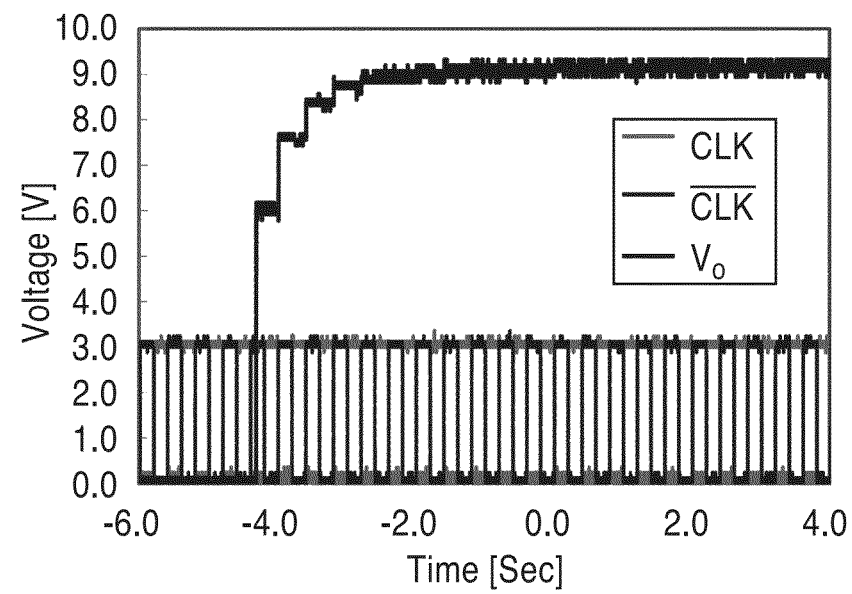
FIG. 15B is a graph of output waveforms of 2-stage charge pump versus time, showing boosting of 3 V supply voltage, CLK, and $\overline{CLK}$ signal by 3×, to a 9 V output $V_{out}$.

Refer now to FIG. 15B, which is a graph of output waveforms of 2-stage charge pump versus time, showing boosting of 3 V supply voltage, CLK, and $\overline{CLK}$ signal by 3×, to a 9 V output $V_{out}$.

Figure 16:
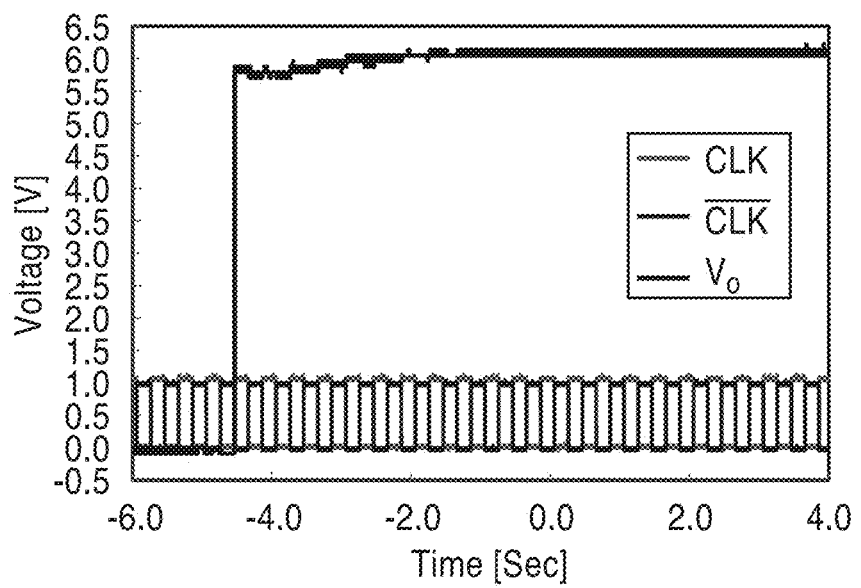
FIG. 16 is a graph of output waveforms of a 5-stage MEMS-based charge pump that pumps the 1 V supply voltage 1 V supply voltage, CLK, and $\overline{CLK}$ to a 6 V output $V_{out}$.

Refer now to FIG. 16, which is a graph of output waveforms of a 5-stage MEMS-based charge pump that pumps the 1 V supply voltage 1 V supply voltage, CLK, and $\overline{CLK}$ to a 6 V output $V_{out}$. Given N stages, the output voltage level can very simply be calculated using:

$$V_o = V_{DD} + N \times V_{DD} = (N+1) V_{DD} \qquad \text{Eq. 2}$$

N-Stage Dickson Charge Pump Results

The MEMS-based Dickson charge pump shown here successfully boosts supply voltages by 3× and 6× using 2-stage and 5-stage designs, respectively. By removing the diode drop and junction breakdown issues of conventional transistor implementations, this MEMS-based charge pump can transfer charge with any input voltage level and can actually achieve ultra-high voltages needed by MEMS devices—something that becomes exponentially more difficult as CMOS continues to scale.

CONCLUSIONS

A micromechanical Dickson charge pump employing comb-driven resonant switches has been shown to boost 1 V of $V_{DD}$ to 2 V in one implementation, and 6 V in a multiple stage implementation. In doing so, this mechanical circuit opens a path towards much higher voltages attained by merely utilizing more charge pumping stages—something easily done adjacent to a given MEMS device, using virtually the same fabrication process sequence that was used to realize that the particular MEMS device. By raising voltages directly on the MEMS chip, the mechanical charge pump greatly improves MEMS device performance, while simultaneously lowering cost by obviating the necessity for other, relatively expensive, custom high voltage CMOS processes.

With this technology, MEMS designers no longer need to be as constrained within limits of permissible voltage levels.

From the description herein, it will be appreciated that that the technology described herein encompasses multiple embodiments which include, but are not limited to, the following:

1. A switch apparatus, comprising: (a) a substrate; (b) a drive electrode attached to the substrate; (c) one or more anchors attached to the substrate; (d) an output electrode attached to the substrate; (e) a shuttle comprising: (i) a contact; (ii) an electrical connection supplied to the shuttle; (iii) one or more beams that electrically and mechanically connect the shuttle to the anchors; (iv) two or more comb fingers capacitively coupled to the drive electrode, whereby the shuttle is driven; and (f) an output electrode; (g) whereby the output electrode is placed in a closed state by a movement of the shuttle that causes the shuttle contact to electrically contact the output electrode.

2. The switch apparatus of any previous embodiment, wherein the shuttle is suspended above the substrate.

3. The switch apparatus of any previous embodiment, wherein the output electrode contacts the shuttle contact upon a sufficient amplitude oscillation of the shuttle imparted by the drive electrode.

4. A charge pump comprising at least one of the switch apparatuses of any previous embodiment.

5. A MEMS resonator biased by one or more of the charge pumps of any previous embodiment.

6. A power converter comprising at least one of the switch apparatuses of any previous embodiment.

7. The switch apparatus of any previous embodiment, wherein the shuttle contact periodically electrically connects to the output electrode within a bandwidth of vibration of the shuttle.

8. The switch apparatus of any previous embodiment, wherein the drive electrode drives the shuttle within an operational bandwidth to periodically electrically connect the shuttle contact with the output electrode.

9. The switch apparatus of any previous embodiment, wherein the shuttle is polysilicon or a metal.

10. The switch apparatus of any previous embodiment, wherein the switch has a Q selected from a group of Q's consisting of: ≥10000, ≥12500, ≥15000, ≥20000, ≥30000, and ≥40000.

11. The switch apparatus of any previous embodiment, wherein the drive electrode operates with a DC bias voltage superimposed upon an AC drive voltage.

12. The switch apparatus of any previous embodiment, wherein the switch operates within an ambient condition selected from a group of ambient conditions consisting of: vacuum, air, nitrogen, argon, and $SF_6$.

13. The switch apparatus of any previous embodiment, wherein the switch apparatus is monolithically fabricated along with one or more complementary metal oxide silicon (CMOS) elements.

14. The switch apparatus of any previous embodiment, wherein the shuttle contact is substantially rectangular or substantially triangular.

15. The switch apparatus of any previous embodiment, wherein the shuttle contact is selected from a group of materials selected from: polysilicon, metal, ruthenium, nickel, and a metal silicide.

16. The switch apparatus of any previous embodiment, wherein the drive electrode is driven by a gated waveform.

17. The switch apparatus of any previous embodiment, wherein the gated waveform is a gated sinusoid comprising a gating period different from a resonant frequency of the shuttle.

18. The switch apparatus of any previous embodiment, wherein the comb fingers are interdigitated from both the drive electrode and the shuttle.

19. A resonant switch, comprising: (a) a substrate, comprising: (i) a drive electrode; (ii) one or more anchors; (iii) an output electrode; and (b) a shuttle spaced above the substrate and connected to the anchors with at least one beam, the shuttle comprising a contact; (c) wherein the drive electrode oscillates the shuttle; and (d) wherein driven element periodically electrically connects the shuttle contact with the output electrode.

20. The resonant switch of any previous embodiment, wherein the drive electrode comprises drive comb fingers.

21. The resonant switch of any previous embodiment, wherein the shuttle comprises shuttle comb fingers.

22. The resonant switch of any previous embodiment, wherein the drive comb fingers and the shuttle comb fingers are interdigitated.

23. The resonant switch of any previous embodiment, wherein the beam is folded.

24. The resonant switch of any previous embodiment, wherein the shuttle contact is selected from a group shuttle contacts consisting of: substantially rectangular and substantially triangular.

25. The resonant switch of any previous embodiment, wherein the shuttle contact is selected from a group of materials selected from: polysilicon, metal, ruthenium, nickel, and a metal silicide.

26. The resonant switch of any previous embodiment, wherein the drive electrode is driven by a gated waveform.

27. The resonant switch of any previous embodiment, wherein the gated waveform is a gated sinusoid comprising a gating period different from a resonant frequency of the shuttle.

28. A charge pump comprising at least one of the resonant switches of any previous embodiment.

29. A MEMS resonator biased by one or more of the charge pumps of any previous embodiment.

30. A power converter comprising at least one of the resonant switches of any previous embodiment.

31. A charge pump, comprising: (a) one or more of the resonant switches of any previous embodiment, each resonant switch comprising a resonant frequency; (b) wherein each resonant switch is driven at its respective resonant frequency.

32. A method of resonant switching, comprising: (a) providing a resonant switch apparatus, said resonant switch apparatus comprising: (i) a substrate; (ii) a shuttle that oscillates; (iii) a shuttle contact proximal to an output electrode, the shuttle contact disposed on the shuttle; and (iv) a drive electrode to the shuttle; and (b) driving the shuttle with the drive electrode, so as to cause an amplitude of oscillation of the shuttle sufficient to cause impact of the shuttle contact with the output electrode.

33. The method of resonant switching of any previous embodiment, wherein the shuttle is disposed above the substrate.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for." No claim element herein is to be construed as a "step plus function" element unless the element is expressly recited using the phrase "step for.

What is claimed is:

1. A switch apparatus, comprising:
   (a) a substrate;
   (b) a drive electrode attached to the substrate;
   (c) one or more anchors attached to the substrate;
   (d) an output electrode attached to the substrate;
   (e) a shuttle comprising:
      (i) a contact;
      (ii) an electrical connection supplied to the shuttle;
      (iii) one or more beams that electrically and mechanically connect the shuttle to the anchors;
      (iv) two or more comb fingers capacitively coupled to the drive electrode, whereby the shuttle is driven; and
   (f) an output electrode;
   (g) whereby the output electrode is placed in a closed state by a movement of the shuttle that causes the shuttle contact to electrically contact the output electrode.

2. The switch apparatus of claim 1, wherein the shuttle is suspended above the substrate.

3. The switch apparatus of claim 1, wherein the output electrode contacts the shuttle contact upon a sufficient amplitude oscillation of the shuttle imparted by the drive electrode.

4. A charge pump comprising at least one of the switch apparatuses of claim 1.

5. A MEMS resonator biased by one or more of the charge pumps of claim 4.

6. A power converter comprising at least one of the switch apparatuses of claim 1.

7. The switch apparatus of claim 1, wherein the shuttle contact periodically electrically connects to the output electrode within a bandwidth of vibration of the shuttle.

8. The switch apparatus of claim 7, wherein the drive electrode drives the shuttle within an operational bandwidth to periodically electrically connect the shuttle contact with the output electrode.

9. The switch apparatus of claim 1, wherein the shuttle is polysilicon or a metal.

10. The switch apparatus of claim 1, wherein the switch has a Q selected from a group of Q's consisting of: ≥10000, ≥12500, ≥15000, ≥20000, ≥30000, and ≥40000.

11. The switch apparatus of claim 1, wherein the drive electrode operates with a DC bias voltage superimposed upon an AC drive voltage.

12. The switch apparatus of claim 1, wherein the switch operates within an ambient condition selected from a group of ambient conditions consisting of: vacuum, air, nitrogen, argon, and $SF_6$.

13. The switch apparatus of claim 1, wherein the switch apparatus is monolithically fabricated along with one or more complementary metal oxide silicon (CMOS) elements.

14. The switch apparatus of claim 1, wherein the shuttle contact is substantially rectangular or substantially triangular.

15. The switch apparatus of claim 1, wherein the shuttle contact is selected from a group of materials selected from: polysilicon, metal, ruthenium, nickel, and a metal silicide.

16. The switch apparatus of claim 1, wherein the drive electrode is driven by a gated waveform.

17. The switch apparatus of claim 16, wherein the gated waveform is a gated sinusoid comprising a gating period different from a resonant frequency of the shuttle.

18. The switch apparatus of claim 1, wherein the comb fingers are interdigitated from both the drive electrode and the shuttle.

19. A resonant switch, comprising:
   (a) a substrate, comprising:
      (i) a drive electrode;
      (ii) one or more anchors;
      (iii) an output electrode; and
   (b) a shuttle spaced above the substrate and connected to the anchors with at least one beam, the shuttle comprising a contact;
   (c) wherein the drive electrode oscillates the shuttle; and
   (d) wherein driven element periodically electrically connects the shuttle contact with the output electrode.

20. The resonant switch of claim 19, wherein the drive electrode comprises drive comb fingers.

21. The resonant switch of claim 20, wherein the shuttle comprises shuttle comb fingers.

22. The resonant switch of claim 21, wherein the drive comb fingers and the shuttle comb fingers are interdigitated.

23. The resonant switch of claim 19, wherein the beam is folded.

24. The resonant switch of claim 19, wherein the shuttle contact is selected from a group shuttle contacts consisting of: substantially rectangular and substantially triangular.

25. The resonant switch of claim 19, wherein the shuttle contact is selected from a group of materials selected from: polysilicon, metal, ruthenium, nickel, and a metal silicide.

26. The resonant switch of claim 19, wherein the drive electrode is driven by a gated waveform.

27. The resonant switch of claim 26, wherein the gated waveform is a gated sinusoid comprising a gating period different from a resonant frequency of the shuttle.

28. A charge pump comprising at least one of the resonant switches of claim 19.

29. A MEMS resonator biased by one or more of the charge pumps of claim 28.

30. A power converter comprising at least one of the resonant switches of claim 19.

31. A charge pump, comprising:
   (a) one or more of the resonant switches of claim 19, each resonant switch comprising a resonant frequency;
   (b) wherein each resonant switch is driven at its respective resonant frequency.

32. A method of resonant switching, comprising:
   (a) providing a resonant switch apparatus, said resonant switch apparatus comprising:
      (i) a substrate;
      (ii) a shuttle that oscillates;
      (iii) a shuttle contact proximal to an output electrode, the shuttle contact disposed on the shuttle; and
      (iv) a drive electrode to the shuttle; and
   (b) driving the shuttle with the drive electrode, so as to cause an amplitude of oscillation of the shuttle sufficient to cause impact of the shuttle contact with the output electrode.

33. The method of resonant switching of claim 32, wherein the shuttle is disposed above the substrate.

* * * * *